United States Patent
Kattoju

(10) Patent No.: US 7,405,553 B1
(45) Date of Patent: Jul. 29, 2008

(54) LOAD TESTING OF UNINTERRUPTED POWER SUPPLY SYSTEMS USING REGENERATIVE LOADING BY SUPPLYING PERCENTAGE OF A TEST POWER

(75) Inventor: Veerabhadra R. Kattoju, Morristown, NJ (US)

(73) Assignee: AT&T Corp., New York, NY (US)

( * ) Notice: Subject to any disclaimer, the term of this patent is extended or adjusted under 35 U.S.C. 154(b) by 458 days.

(21) Appl. No.: 11/263,054

(22) Filed: Oct. 31, 2005

(51) Int. Cl.
*H02J 9/00* (2006.01)
*H02J 9/06* (2006.01)

(52) U.S. Cl. .................................. 324/158.1; 324/771

(58) Field of Classification Search ........................ None
See application file for complete search history.

(56) References Cited

U.S. PATENT DOCUMENTS

| | | | | |
|---|---|---|---|---|
| 4,001,666 A | * | 1/1977 | Grenfell | 322/4 |
| 4,357,574 A | * | 11/1982 | Takamisawa et al. | 324/72.5 |
| 4,849,651 A | * | 7/1989 | Estes, Jr. | 307/125 |
| 4,860,185 A | * | 8/1989 | Brewer et al. | 363/41 |
| 5,077,512 A | * | 12/1991 | Weber | 318/776 |
| 5,172,009 A | * | 12/1992 | Mohan | 307/46 |
| 5,864,101 A | * | 1/1999 | Nishizawa et al. | 187/285 |
| 6,236,226 B1 | * | 5/2001 | Hagiwara | 324/771 |
| 6,459,175 B1 | * | 10/2002 | Potega | 307/149 |

FOREIGN PATENT DOCUMENTS

| | | | | |
|---|---|---|---|---|
| EP | 1659415 A2 | * | 5/2006 |
| JP | 11258287 A | * | 9/1999 |
| JP | 2000201440 A | * | 7/2000 |
| JP | 2001061237 A | * | 3/2001 |
| JP | 2006149190 A | * | 6/2006 |

* cited by examiner

*Primary Examiner*—Paresh Patel
(74) *Attorney, Agent, or Firm*—Priest & Goldstein, PLLC

(57) ABSTRACT

To ensure high level of reliability, it is desirable to test an electrical device, such as an uninterruptible power supply (UPS) system, periodically with minimum possible energy usage and without compromising reliability. A regenerative load (RGL) unit is described which makes it possible to conduct a load test of a UPS system and supply a portion of the energy used for the load test from a generator in the RGL unit. An induction motor driven by an adjustable speed drive and coupled to an induction generator is used in the RGL unit to supply the load to the electrical device and supply a portion of the power used by the electrical device under test.

20 Claims, 6 Drawing Sheets

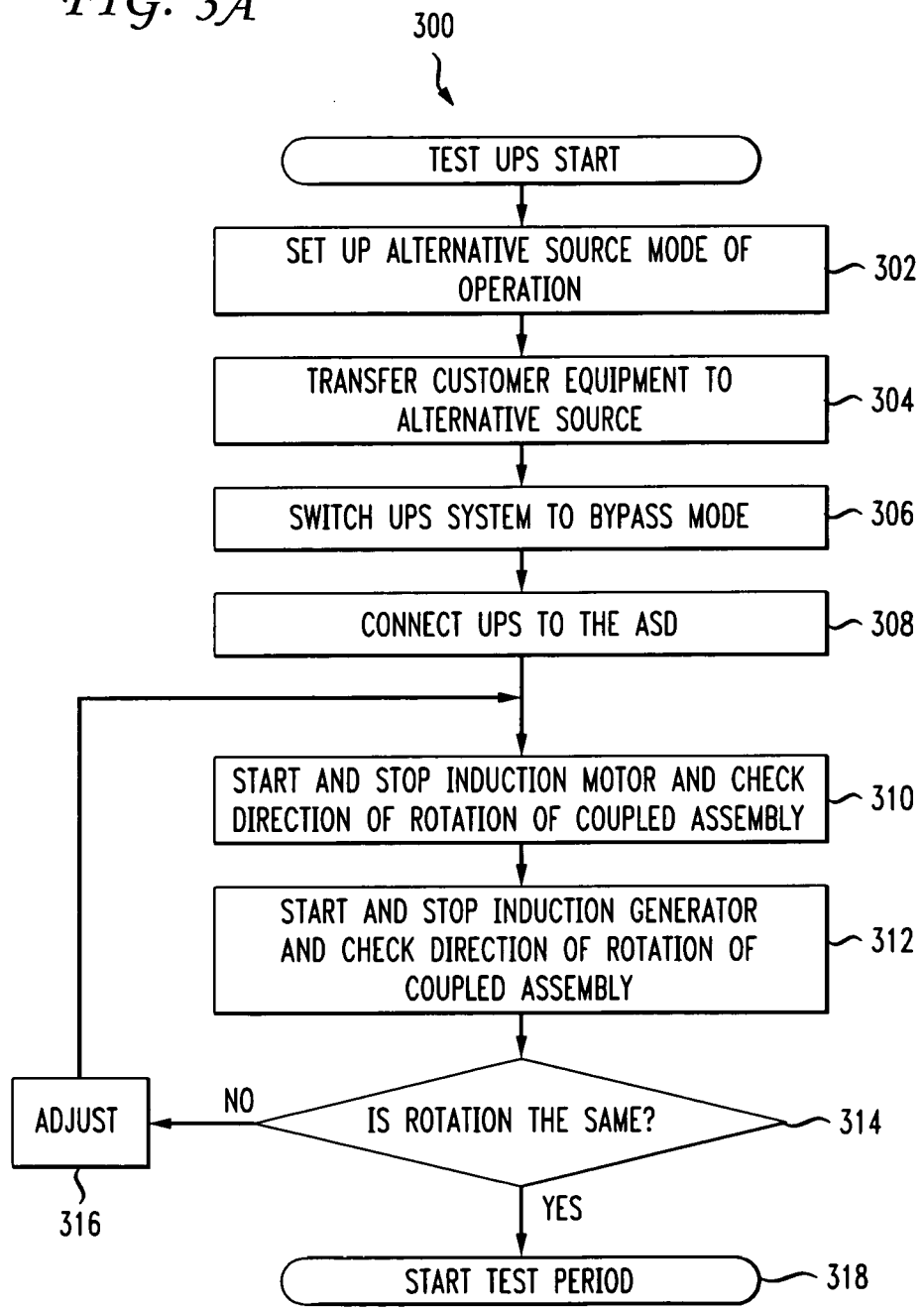

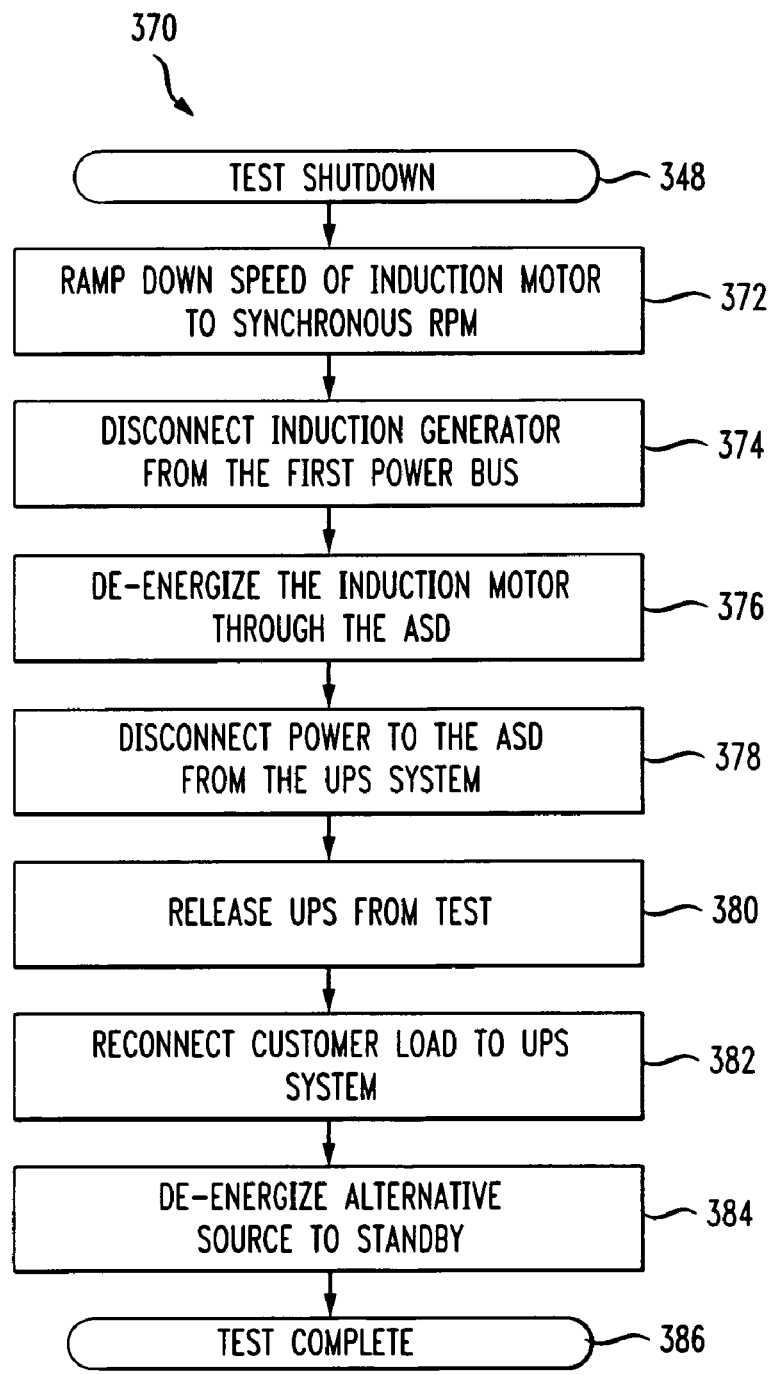

LOAD TESTING OF UNINTERRUPTED POWER SUPPLY SYSTEMS USING REGENERATIVE LOADING BY SUPPLYING PERCENTAGE OF A TEST POWER

FIELD OF INVENTION

This invention relates generally to load testing of uninterrupted power supply systems and, in particular, to the load testing using regenerative loading techniques for testing and conservation of energy.

BACKGROUND OF INVENTION

Uninterrupted power supply (UPS) systems are widely used in contexts where having an electrically stable and reliable power supply is critical for the operation of equipment and systems. UPS systems are typically of the standby, line interactive, or online double conversion design. These three UPS designs provide different levels of protection from electrical power disturbances, such as voltage surges, or failures, such as black outs. As an example, many data centers use online double conversion UPS designs that provide a high level of protection.

An online double conversion UPS system typically draws alternating current (AC) power from a commercial power grid and converts the AC to direct current (DC). The DC supply is used to keep a battery fully charged and is converted back to AC in an inverter to deliver clean, regulated AC power as required by a customer's equipment. The battery is of sufficient capacity to provide backup power for the equipment being protected. If there is an interruption to the supply of AC power to the UPS, energy stored in the batteries is used to feed the inverter which will continue to provide the required AC power for the customer's equipment for a predetermined period of time.

To ensure a high level of reliability, UPS manufacturers conduct extensive testing at their factories and also at installation sites during initial setup and commissioning. UPS systems are also tested periodically by end users to ensure their continued reliable operation. These tests typically include full load testing using a resistive load bank. Power from the UPS is delivered to the resistive load bank over a lengthy test period, such as a period from one to four hours. The UPS output is converted to heat in the resistive load bank which is dissipated to the surrounding air. As a consequence, the resistive load bank requires adequate ventilation, such as may be provided by mechanical ventilation equipment, to dissipate the heat and must be kept away from combustible material and vapors. Since a large number of the electrical industry and user groups use resistive load banks for testing electrical equipment, such as UPS systems, a significant amount of energy is lost performing the tests. Consequently, manufacturers, as well as users of UPS systems, incur significant costs to pay for the energy used during testing, and may further incur a demand charge that is based on the time of the day when a test is run.

SUMMARY OF INVENTION

Among its several aspects, the present invention recognizes that it would be desirable to provide alternate UPS test methods and apparatus to reduce the usage of electrical energy during such testing. Full load and overload testing of uninterrupted power supply (UPS) systems at the factory and periodic full load testing by the user are important to ensure continued reliable operation of UPS systems. With the present invention, a testing system receiving the UPS output is capable of returning all or part of the UPS output to the commercial power grid, allowing a significant amount of the energy to be saved.

According to one aspect of the invention, a regenerative load (RGL) apparatus is used for testing an electrical device having an input and an output. The input of the electrical device is connected to a primary source of power and the output of the electrical device is connected to the input of the RGL apparatus as a load for the electrical device. The output of the RGL apparatus is connected to the primary source of power, the RGL apparatus supplying A % of the test power required to operate the electrical device, whereby the electrical device receives 100% of the test power it requires under load while using only (100-A) % of the test power from the primary source of power.

According to another aspect of the invention, a method of testing an electrical device connects, in a first step, the electrical device to a primary source of power and, in a second step, connects a regenerative load (RGL) unit to the electrical device as a load. In the next step, the RGL unit output is connected to the primary source of power and in the following step the RGL unit supplies A % of the power to operate the electrical device during testing of the electrical device, whereby the electrical device receives 100% of the power it requires under load while using only (100-A) % of the power from the primary source of power.

A more complete understanding of the present invention, as well as other features and advantages of the invention, will be apparent from the following detailed description and the accompanying drawings.

BRIEF DESCRIPTION OF DRAWINGS

FIG. 3A illustrates an RGL test set up procedure in accordance with the present invention;

FIG. 3D illustrates an RGL test shut down procedure in accordance with the present invention.

DETAILED DESCRIPTION

The present invention will now be described more fully with reference to the accompanying drawings, in which several embodiments and various aspects of the invention are shown. This invention may, however, be embodied in various forms and should not be construed as being limited to the embodiments set forth herein. Rather, these embodiments are provided so that this disclosure will be thorough and complete, and will fully convey the scope of the invention to those skilled in the art.

Figure 1:
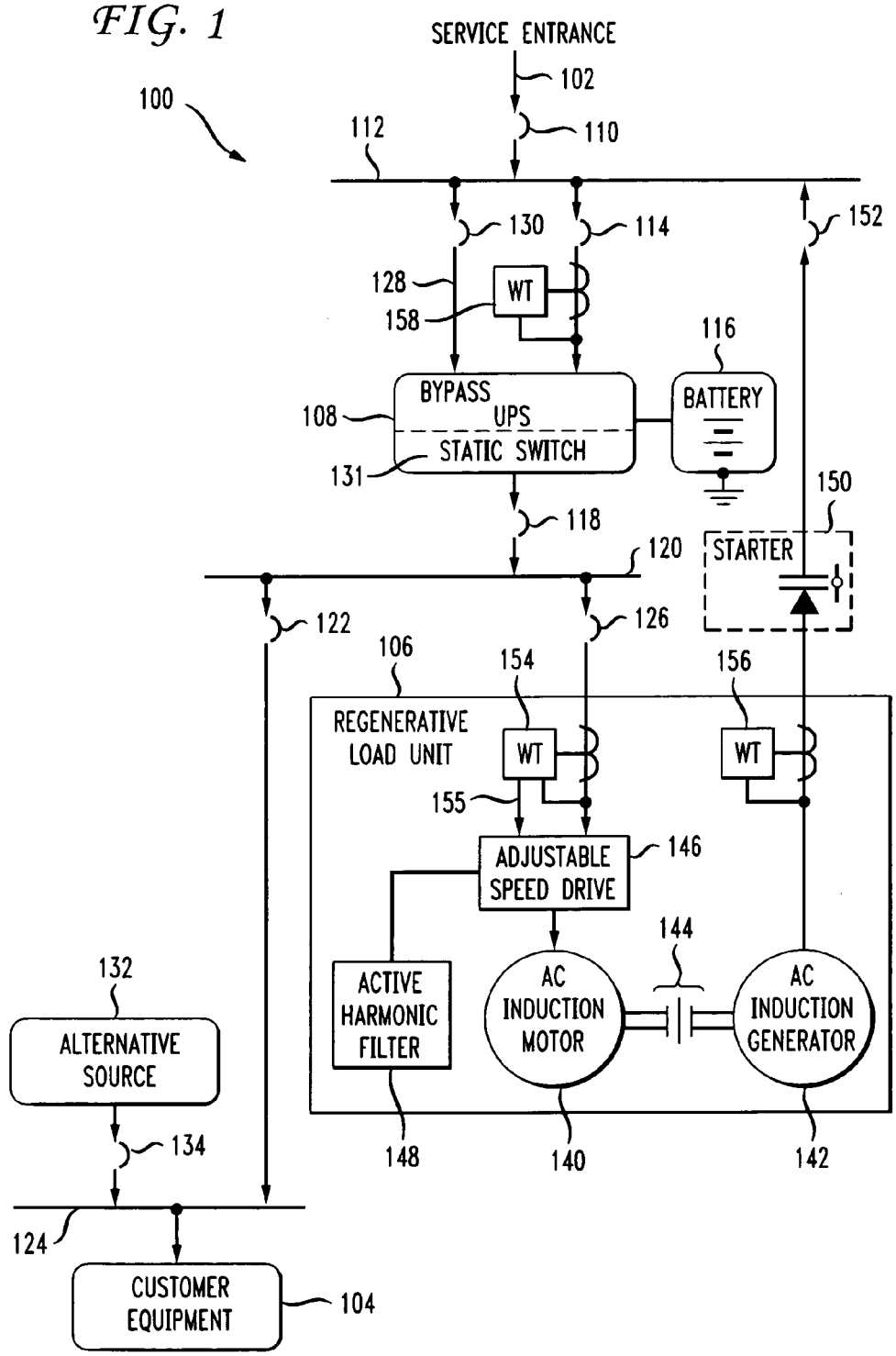
FIG. 1 illustrates a high level view of a regenerative load (RGL) test system for testing an electrical device and for conservation of energy in accordance with the present invention.

FIG. 1 illustrates an exemplary regenerative load (RGL) test system 100 for testing an electrical device, such as an uninterruptible power supply (UPS) in accordance with the present invention. The RGL test system 100 is shown in a system configuration where power may be supplied from a commercial power grid service entrance 102 to customer equipment 104 or to RGL unit 106. Customer equipment 104 may include computer and communication equipment found in a data center or the like. To protect the customer equipment 104 from disturbances and failures of the input power, a UPS 108 is used. The UPS 108 may suitably be, for example, a double conversion online UPS that will be periodically tested to ensure reliability by the regenerative load (RGL) unit 106 with adjustable load capability.

When a circuit breaker 110 is closed, input AC power is supplied from the commercial power grid service entrance 102 to a first power bus 112 which in turn supplies power across circuit breaker 114 to the UPS 108. When supplying power, either to the customer equipment 104 or to the RGL unit 106, under normal operating conditions, the AC power from the first power bus 112 is converted to DC in the UPS 108 in order to maintain a battery 116 in a fully charged state and to provide a protected source of power on the UPS output. In a normal operating mode, the UPS 108 supplies power across a circuit breaker 118 to a second power bus 120. To operate the customer equipment 104 from the second power bus 120, the power is supplied across circuit breaker 122 to a third power bus 124, and then to the customer equipment 104. It is noted that there may be additional circuit breakers serving the customer equipment, but only selected circuit breakers are shown for simplicity of presentation.

Since simultaneous connection of RGL unit 106 and the customer equipment 104 to the output of the UPS 108 could lead to a UPS overload condition, circuit breakers 122 and 126 are not simultaneously closed. A first example of power distribution has circuit breakers 110, 114, 118, and 122 closed, allowing, for example, 194 kW of power to be supplied from service entrance 102 to a 480 volt 3 phase, 3 wire bus 112 and to the UPS 108. The UPS 108 then supplies power, for example, 180 kW/225 kVA 480 volt 3 phase AC power, due to internal conversion losses of approximately 7.4% in the UPS 108, to the second power bus 120. The 180 kW/225 kVA 480 volt 3 phase AC power is then supplied to a third power bus 124 and then to the customer equipment 104.

A bypass path 128 is used in testing of the UPS 108 as described below. The bypass path 128 connects power from the first power bus 112 across circuit breaker 130 to the UPS 108 which provides a bypass path to the output of the UPS 108 for use in a number of instances, such as, testing of the UPS, clearing a fault condition on the output of the UPS, an internal failure of the UPS, overload conditions, and any other detected abnormal UPS condition. The UPS 108 may be selected to operate in a bypass mode of operation depending on the condition by use of a static switch 131 located in the UPS 108. Some static switch designs use circuit breakers to carry the load current flowing through the bypass path after the load is transferred, thereby off loading the static switch. The test systems described herein may be used to test the bypass path 128 to ensure reliable UPS system operation. Note that maintenance paths and circuit breakers associated with such maintenance paths are not shown, but may be used to isolate the UPS 108 for repairs or periodic maintenance without disrupting power to the customer equipment 104.

If power is lost from the service entrance 102, the UPS 108 supplies power by discharging the battery 116. Depending upon the battery capacity and load of the customer equipment 104, power supplied from the battery 116 can be maintained only for a predetermined period of time, for example, up to fifteen minutes. The battery support period of time allows either for an orderly shutdown of the customer equipment 104 or for a standby generator to restore AC power input to the UPS 108.

The exemplary RGL test system 100 uses a regenerative load unit 106 having an AC induction motor 140 and an AC induction generator 142. In order to describe the operation of the RGL test system 100 during testing and the regenerative load unit 106, brief descriptions of an induction motor and an induction generator are provided.

An induction motor has a stationary part referred to as a stator, having copper windings, and a rotating part referred to as a rotor, such as a cage rotor. When power is applied to the induction motor, a rotating magnetic field is created by the stator windings. The rotor rotates at a rate in revolutions per minute (RPM) that is slightly slower than a theoretical synchronous RPM rate of 120 F/p, where F is the AC frequency and p is the number of poles in the stator winding. For example, with an AC frequency of 60 Hz and four poles, a theoretical synchronous 1800 RPM is obtained as a motor rating. When a load is applied to the rotor shaft, the rotor slows down and a state of equilibrium is reached at a rotor speed that is lower than the synchronous rating while carrying the applied load. For example, a 150 horsepower rated induction motor can deliver full output at 1,785 RPM. The speed of the motor may be adjusted by use of an adjustable frequency control, also known as an adjustable speed drive (ASD).

An induction motor may also operate as an induction generator, if the rotor of the induction motor is externally driven above the motor's rated synchronous RPM while the stator of the motor is connected to an AC power source. Above the synchronous RPM, the induced voltage and current in the rotor are in a reverse direction as compared to the rotor current direction when operating as an induction motor. The induced voltage and current in the rotor then induces voltage in the stator windings and power flows out of the stator into a circuit connected to the stator. The induction motor now operates as an induction generator. With an induction motor coupled to the induction generator, part of the mechanical energy applied to the rotor of the induction generator is used to overcome friction, wind losses, and copper and iron losses in the rotor and stator. The electrical power output of the induction generator varies with the motor speed above the synchronous RPM. This power output typically peaks in a relatively narrow region above the synchronous RPM, and decreases thereafter. To obtain efficient generation of power, the speed of driving the induction generator must be controlled.

In order to fully test the UPS 108, power to the customer equipment 104 is transferred to an alternative source 132 by opening circuit breaker 122 and closing circuit breaker 134 thereby isolating the UPS 108 from the load of the customer equipment 104. Note that power is transferred in a "no break" or a "make before break" mode to avoid service interruption. Once this transfer has occurred, the circuit breaker 126 may be closed thereby connecting the UPS 108 to the regenerative load unit 106. Driving the induction motor and induction generator combination provides a test load to the UPS 108 while providing a power output that may be used for other purposes.

The induction motor 140 and induction generator 142 are sized according to the testing task and have appropriate synchronous RPM ratings. For example, to test an 180 kW UPS system, a regenerative load (RGL) test system is used having at least a 243 horsepower (hp) induction motor. In order to permit limited overload tests and to use a commercially available standard motor, a 300 hp induction motor coupled to a 300 hp induction generator is used. A 200 kW adjustable speed drive provides sufficient capacity to drive the 300 hp induction motor and provide adequate loading to the 180 kW UPS system. Using the same size induction motor and induction generator is desirable to facilitate easy application of mechanical coupling of the induction motor and the induction generator in the RGL test system. A 4-pole 1800 RPM induction motor and induction generator combination may be used instead of a 2-pole 3600 RPM motor and generator combination, offering a 50% reduction in speed without additional cost. Further reduction in RPM, requiring an additional cost, is not deemed necessary for the successful operation of this exemplary RGL test system.

As indicated above and as shown in the FIG. 1, the induction motor 140 and the induction generator 142 are mechanically coupled by mechanical coupling 144. Without adjusting the speed of the induction motor 140, the induction motor 140 operates below its rated synchronous speed, where such synchronous speed is dictated by the power source, for example, a 60 Hz power source. Since the induction generator 142 must run at a higher RPM than its rated synchronous speed to operate as a generator of 60 Hz output, it is necessary to use an adjustable speed drive (ASD) 146 to run the induction motor 140 at an RPM above the synchronous RPM and within the range of operation required by the induction generator 142.

Figure 2:
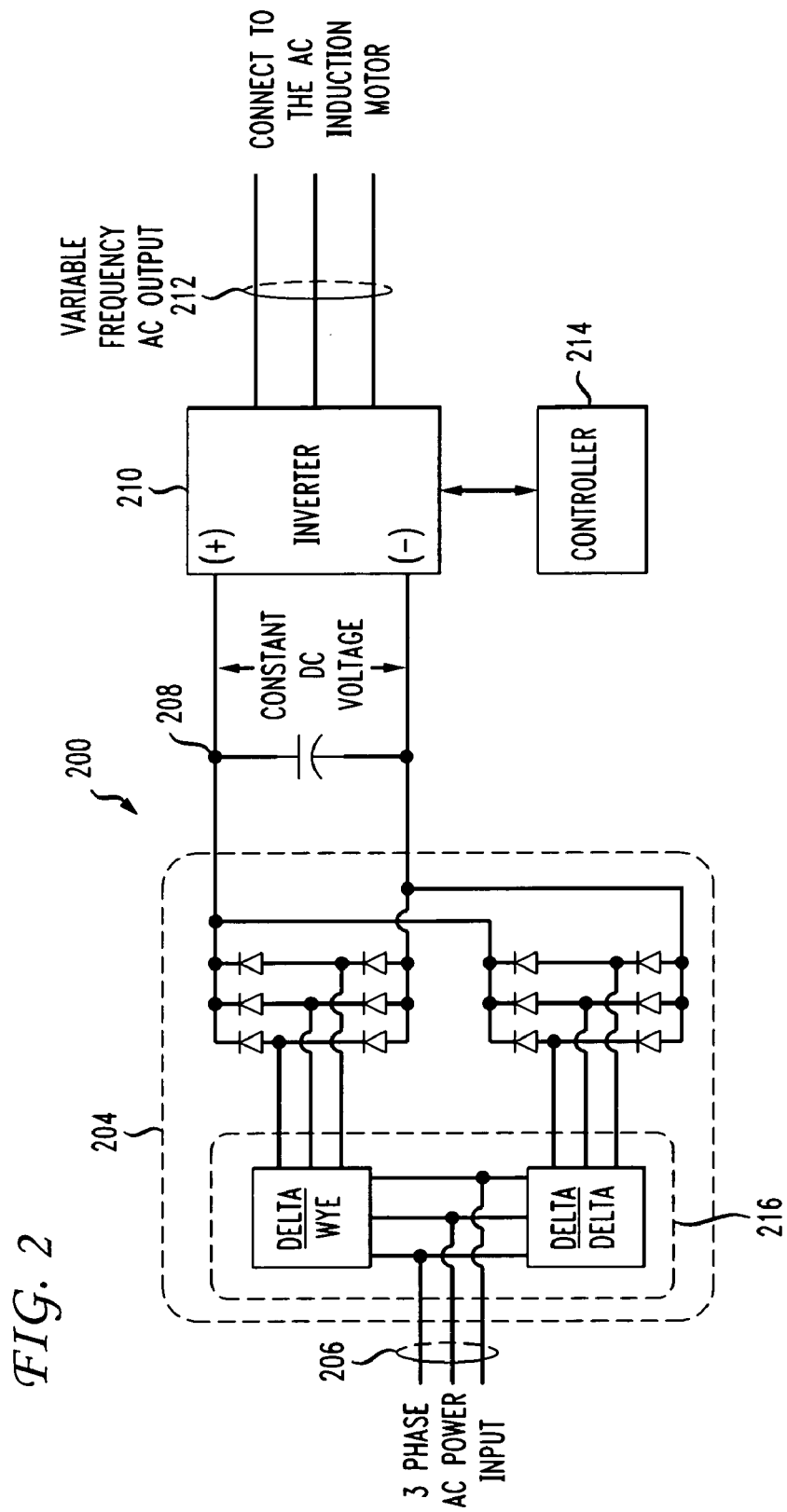
FIG. 2 illustrates a diode bridge twelve pulse converter front end configuration adjustable speed drive (ASD) that operates in accordance with the present invention.

FIG. 2 illustrates an exemplary diode bridge twelve pulse converter ASD 200, which may suitably be employed as the ASD 146 of FIG. 1. It will be recognized that eighteen pulse or twenty-four pulse converter ASDs may also be suitably used. The converter 204 of the ASD changes the 3 phase AC power input 206 to a DC voltage at circuit node 208 and the inverter 210 converts the DC voltage to a sinusoidal variable frequency AC output 212 at a frequency set by its controller 214. The converter 204 of the ASD 200 is the primary determining factor on the effects the ASD 200 has on the input power source, which in this case is the UPS 108 output. The effects of converter 204, also known as the front end, fall into three categories. These categories are voltage transients or "notching", harmonics, and power factor.

Notching is caused by a momentary short circuit caused when the flow of power is transferred from one phase to another phase. The current drawn by the converter 204 is distorted, which results in harmonics. The harmonics, if of sufficient magnitude, may cause excessive heat generation in the current carrying components of the UPS 108. Also, the harmonic content of the current tends to lower the power factor due to an increase in reactive power. The value of harmonic current tends to decrease with increase in harmonic order.

A presently preferred approach for this invention is to use ASD 200 having a 12 pulse rectifier fed from a double wound secondary transformer 216 in converter 204. This approach results in a significant reduction in $5^{th}$ and $7^{th}$ harmonic currents. Further reduction in harmonics is possible by the application of active harmonic filters, such as filter 148 of FIG. 1, that comply with IEEE Standard 519 of 1992 "Recommended Practices and Requirements for Harmonic Control in Electrical Power Systems". A power factor of 95% is achievable which is close to a normal operating value of the UPS system.

Figure 3B:
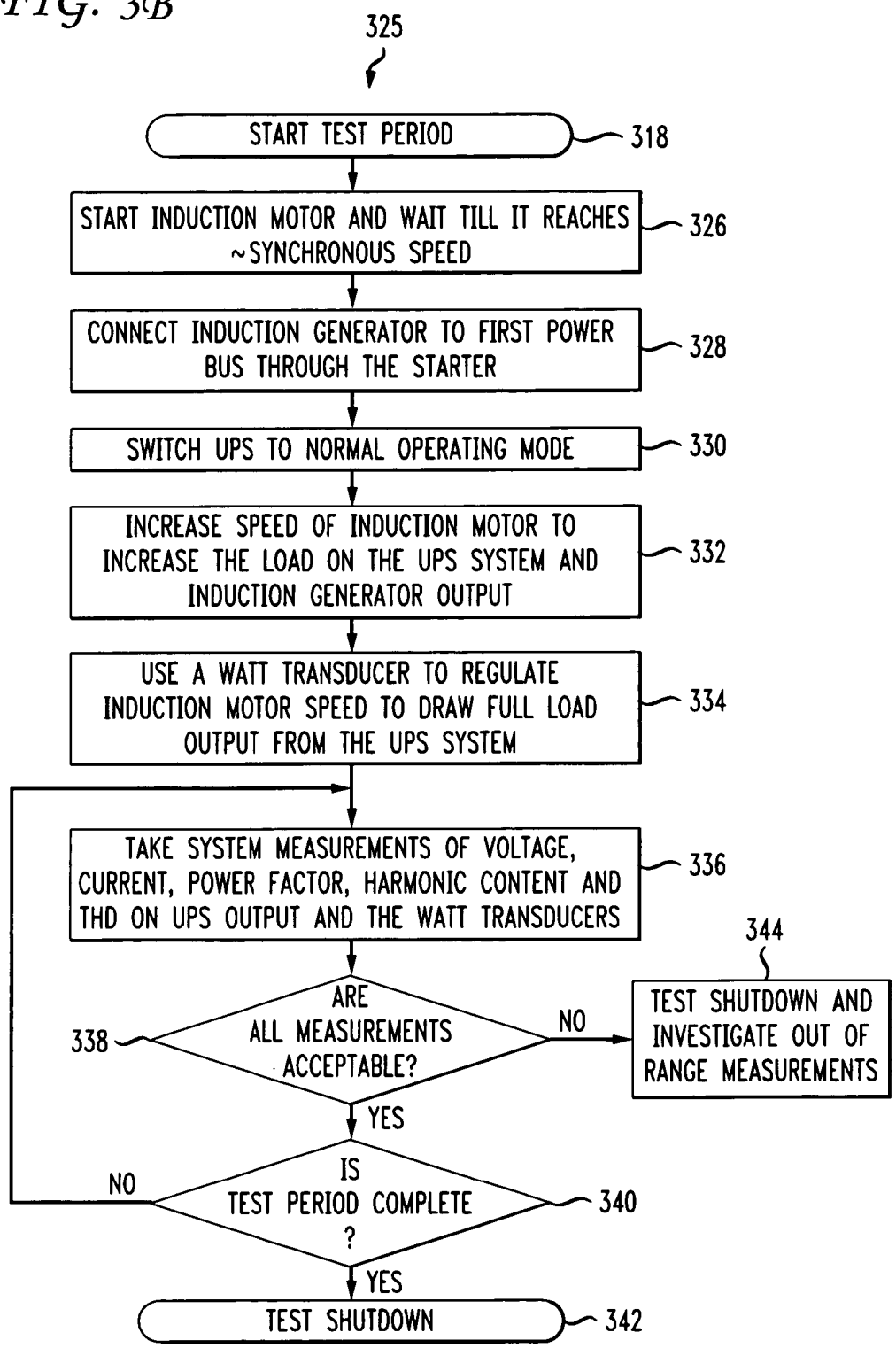
FIG. 3B illustrates an RGL test period procedure for testing of a UPS system in accordance with the present invention.
Figure 3C:
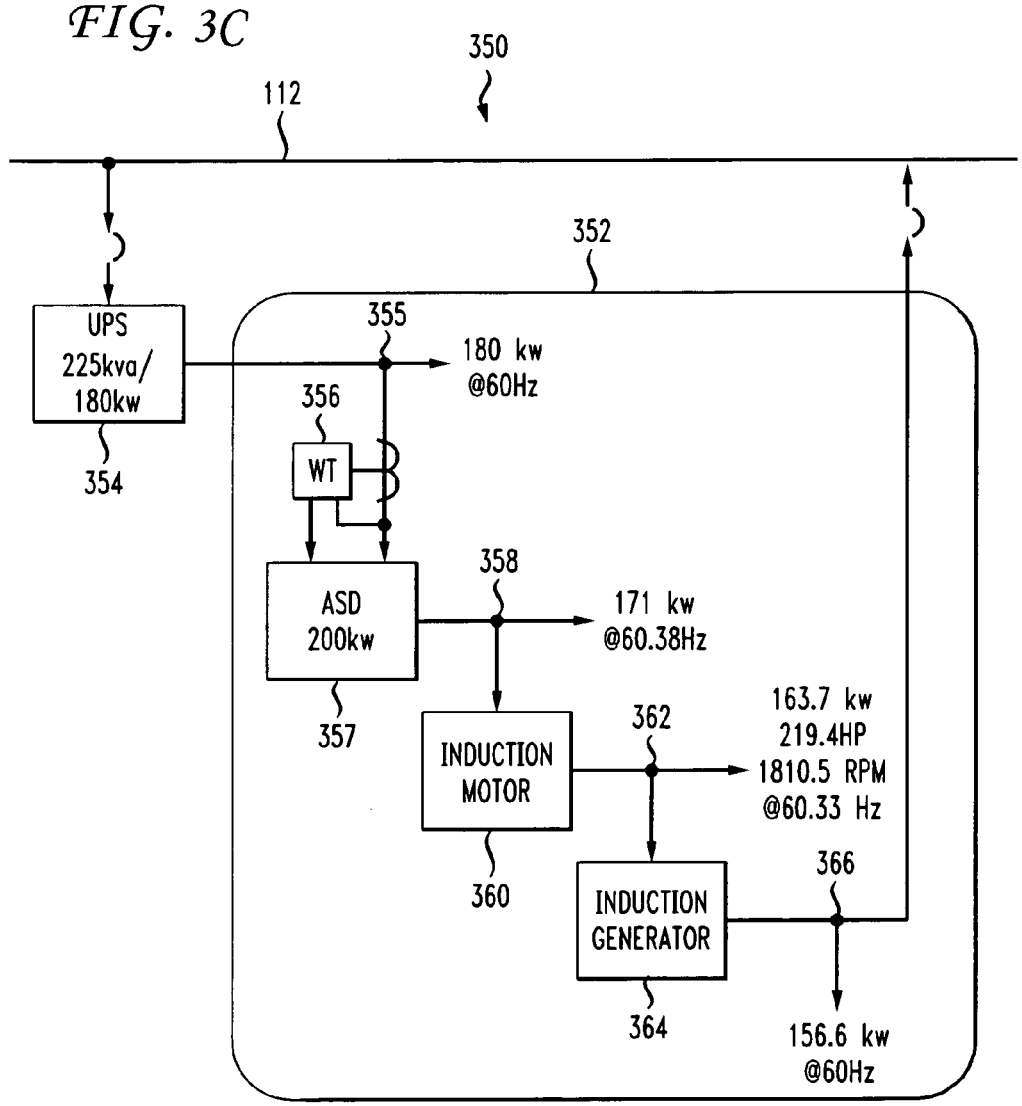
FIG. 3C illustrates an exemplary kilowatt, frequency, and RPM profile for a regenerative load (RGL) test system in accordance with the present invention.

To use the regenerative load unit 106 for testing of the UPS 108 and associated supporting equipment, such as associated circuit breakers and bypass path 128, a test sequence is followed to transfer customer equipment power from the normal operating path to an alternative source, engage the regenerative load unit to test the UPS system, and transfer power back at test completion, assuming a successful test. FIG. 3A illustrates a regenerative load (RGL) test set up procedure 300 in accordance with the present invention. FIG. 3B illustrates an RGL test period procedure 325 for testing of a UPS system in accordance with the present invention. FIG. 3C illustrates an exemplary kilowatt, frequency, and RPM profile 350 for a regenerative load (RGL) test system in accordance with the present invention. FIG. 3D illustrates an RGL test shut down procedure 370 in accordance with the present invention. FIGS. 3A-3D make reference to the apparatus of the RGL test system 100 of FIG. 1 and ASD 200 of FIG. 2 as exemplary.

Beginning with the RGL test set up procedure 300, the alternative source 132 is set up for operation in step 302. The customer equipment 104 is transferred from the UPS 108 to the alternative source 132 in step 304 by opening circuit breaker 122 and closing circuit breaker 134. The UPS 108 to be tested is switched to bypass mode in step 306, though it is not presently carrying any load. With circuit breakers 118 and 126 closed, the output of the UPS 108 is connected to the 3 phase AC power input 206 of the adjustable speed drive (ASD) 200 in step 308. In step 310, the induction motor 140 is started and stopped to check the direction of rotation of the coupled assembly. In step 312, the induction generator 142 is started by use of starter 150 and stopped to check the direction of rotation of the coupled assembly. The rotation of the induction motor 140 and induction generator 142 are compared in decision step 314 to determine if both rotations are the same. If both rotations are not in the same direction, an adjustment is made in step 316 and the rotation checks are repeated. If the rotations are both in the same direction, the set up procedure has completed. The start test period process 325 continues from start test period point 318 to test the UPS 108.

The rotations of both the induction motor 140 and induction generator 142 are checked to ensure there are no problems in operating the RGL unit 106. In step 310, for example, suppose that power is applied to the induction motor 140 by the ASD 146 causing the mechanically coupled induction generator 142 to rotate along with the motor in a clockwise direction as seen from the end of the induction motor 140. It is noted that the motor will rotate at 1785 RPM when driving a load corresponding to, for example, 150 hp. In the case of step 310, the load is approximately a "no load" situation and the motor RPM will be very close to its synchronous RPM rating. To check the direction of rotation, the motor is started and stopped within a few seconds and the assembly may not be on line long enough to reach the no load RPM.

In step 312, the induction generator 142 is connected to the first power bus 112 through the starter 150. Since the induction generator 142 can also act as an induction motor, when the induction generator 142 is connected to the first power bus, the induction generator 142 will attempt to rotate in a specific direction, as may occur, for example, if the induction generator 142 is not up to the required generator speed to generate power. The specific direction in which the induction generator 142 attempts to rotate may be determined in step 312, in which the induction generator 142 is connected to the first power bus 112 while the induction generator 142 is not rotating. In step 312, the first power bus 112 supplies a voltage to the induction generator 142 which establishes a rotating magnetic field in the induction generator 142 and operates the induction generator 142 as an induction motor and the specific direction of rotation is determined.

Consider the case, where the direction of rotation of the induction motor 140 is different from the direction of rotation of the induction generator 142. When the connection of the induction generator 142 is made to the first power bus 112 in a later step of the test procedure, the induction generator 142 is already rotating in the particular direction the induction motor 140 is rotating, such as the clockwise rotation described above. Since the induction motor 140 and induction generator 142 are rotating below the synchronous RPM rating and the induction generator 142 has no rotating magnetic field generated by its stator, as it is not yet connected to the first power bus 112, the induction generator 142 is not generating any output. When the induction generator 142 is connected to the first power bus 112, the applied voltage establishes a rotating magnetic field in the stator of the induction generator 142 which attempts to reverse the direction of rotation of the induction generator 142 while it is already rotating close to synchronous RPM in an opposite direction set by the induction motor 140. This opposition to the induction motor 140 may cause serious damage. Though it is possible to incorporate interlocks in the logic of operation of the starter 150 to prevent the closure of the starter when the direction of rotation set by the motor 140 is not correct, the use of the setup procedure 300 avoids the problem.

Consider the alternative case, where the direction of rotation of the induction motor 140 is the same as the direction of rotation of the induction generator 142. In this case, when the induction generator 142 is connected to the first power bus 112, the voltage from the first power bus 112 establishes a rotating magnetic field in the stator of the induction generator 142 which attempts to drive the induction generator 142 in the same direction it is already rotating and no problem is encountered.

FIG. 3B illustrates the RGL test period procedure 325 for testing of a UPS system which proceeds from start test period step 318. In a first step 326, the induction motor 140 is started and monitored to reach normal operating speed of approximately its rated synchronous speed of 1800 RPM. In step 328, the output of the induction generator 142 is connected to the first power bus 112 by closing circuit breaker 152. In step 330, the UPS 108 is switched to normal operating mode. In step 332, the ASD 146 is used to increase the speed of the induction motor 140 which increases the load on the UPS 108 and to reach the desired operating speed of the induction generator 142. To fully test the UPS 108, the speed of the induction motor 140 is increased until a full load on the UPS 108 is achieved. A three phase watt transducer 154 is used in step 334 to monitor the input power to the regenerative load unit 106. A watt transducer current output 155, representative of the monitored input power, is used by the ASD 146 to regulate the speed of the induction motor 140 in order to draw the full load output from the UPS 108.

FIG. 3C illustrates an exemplary kilowatt, frequency, and RPM profile 350 for a regenerative load (RGL) test system using approximate numbers for a representative system configuration. The profile 350 has a UPS 354 attached to a first power bus 112 with a capacity of 225 kVA and 180 kW and to an RGL unit 352. To obtain the full load UPS output 355 of 180 kW at 60 Hz a watt-transducer (WT) 356 is used to control the ASD 357. For example, a 4-20 mA WT may be used that produces 4 mA with no load on the UPS 354 and a 20 mA output at a maximum sensed power of 291 kW. This corresponds to a 18.19 kW per mA above the 4 mA no load output of the watt transducer. By setting the ASD current to test limit of 13.896 mA or 9.896 mA above the 4 mA no load current, any load on the UPS less than the 13.896 mA will cause the ASD to increase the frequency output above 60 Hz. With a 95% efficient ASD 357, an output 358 of 171 kW at 60.38 Hz is obtained. The ASD 357 drives an induction motor 360 generating 219.4 HP or 163.7 kW on output 362 with a speed of 1810.5 RPM at 60.33 Hz, for example. The induction motor 360 is mechanically coupled to an induction generator 364 having, for example, 95.7% efficiency. The induction generator 364 produces 156.6 kW at 60 Hz on its output 366 that may be coupled to the first power bus 112, thereby supplying a portion of the power used to test the UPS 354. It is expected that with various system components and configurations, the efficiency of the various components may vary.

The regenerative load test use of the induction generator 142 may export, for example, 75% of the energy received during testing of the UPS to the first power bus 112. It is also noted that the induction motor 140 and induction generator 142 do not require any special support or expense for cooling during testing of the UPS system.

Returning to the RGL test period procedure 325 of FIG. 3B, in step 336, system measurements, such as voltage, current, kilowatts, power factor, harmonic content, and THD of the output of the UPS 108 may be made. Also, measurements of the output of the induction generator 142 are made from a three phase watt transducer 156 and UPS input are made from a three phase watt transducer 158. All measured values are checked to be within specified limits of the operating test in decision step 338. If all measurements are within the specified limits, the test is run for a predetermined duration with continued measuring and evaluating the measurements according to a test plan.

Such test plan may also include testing of various UPS operating modes, such as testing the bypass path 128. Determining when the test period is completed is done in decision step 340 which continues the test and measurement cycle if the test is not completed or at completion begins the test shutdown procedure at point 342. If a measurement checked in step 338 is outside an acceptable limit, there may be a problem and the test proceeds to step 344 which stops the test and investigates the out of range measurement. For example, if it is noted that the power output of the UPS has dropped below a predetermined level during the test, a first step checks to see if there are any trouble alarms on the ASD 106. If there are no alarms, diagnostic procedures to check the ASD may then be used. If no problems are detected by the ASD diagnostic procedures, it is possible that a voltage sensing lead on the watt transducer 154 is broken or loose which may be examined and repaired if necessary. Thus, by carefully following a process of elimination, the cause of the original problem may be determined, corrective action taken, and the load test resumed.

FIG. 3D illustrates an RGL test shut down procedure 370 for testing a UPS system. After the test period has completed and step 342 is reached in FIG. 3B, the regenerative load unit is shut down and power transferred from the alternative source 132 to the UPS 108. This process is started in step 372. In step 372, the speed of the induction motor 140 is ramped down to reach normal operating speed of approximately its rated synchronous speed of 1800 RPM. In step 374, the induction generator 142 is disconnected from the first power bus 112 by de-energizing the starter 150 followed by opening circuit breaker 152. Also, note that in the event of a fault in the induction motor 140 or induction generator 142, the starter 150 can be programmed to disconnect the induction generator 142 from the first power bus 112. In step 376, the ASD 146 de-energizes the induction motor 140. In step 378, the ASD 146 is disconnected from the UPS system by opening circuit breaker 126. In step 380, the UPS 108 is released from test. In step 382, the customer equipment 104 is returned to the primary source by opening circuit breaker 134 and closing circuit breaker 122 following a "no break" transfer to avoid service interruption. The alternative source 132 is returned to a standby mode in step 384 and the test completed at step 386.

The RGL test procedures illustrated in FIGS. 3A, 3B, and 3D are presented as a manual sequence of operational steps, though it is appreciated that automated control of such a procedure may be implemented. For safety reasons, wiring practices and operational procedures illustrated or implied comply with applicable local, state and federal, electrical standards, for example, the National Electrical Code and safety standards, for example Occupational Safety and Health Administration (OSHA) standards.

While the present invention has been disclosed in a presently preferred context, it will be recognized that the present teachings may be adapted to a variety of contexts consistent with this disclosure and the claims that follow. For example, the present invention is disclosed mainly in the context of double conversion online UPS systems. It will be appreciated that it may also be employed with other types of UPS systems, such as, standby, line interactive, and the like. It will also be appreciated that variations in the particular hardware and control employed are feasible, and to be expected as both evolve with time. For example, the techniques of the present invention may be used to test other forms of equipment, such as standby generators, marine engines, systems with different operating frequencies, such as 50 cycles per second and 400 cycles per second, and the like. Other such modifications and adaptations to suit a particular design application will be apparent to those of ordinary skill in the art.

I claim:

1. A regenerative load (RGL) apparatus for testing an electrical device, the electrical device having an input connected to a primary source of power and an output, the RGL apparatus comprising:
    an input connected to the electrical device output as a load for the electrical device; and
    an output connected to the primary source of power, the RGL apparatus supplying A % of test power required to operate the electrical device, whereby the electrical device receives 100% of the test power it requires under load while using only (100-A) % of the test power from the primary source of power.

2. The RGL apparatus of claim 1 further comprises:
    an adjustable speed drive (ASD) having an input and an output, the ASD input connected to the output of the electrical device;
    an induction motor connected to the ASD output whereby the ASD controls the speed of the induction motor;
    an induction generator coupled to the induction motor and generating the output of the RGL apparatus, whereby the ASD, the induction motor, and the induction generator act as the load to the electrical device, the induction generator supplying the A % of the test power.

3. The RGL apparatus of claim 2 wherein the ASD is at least a twelve pulse converter ASD.

4. The RGL apparatus of claim 2 further comprising:
    a starter for the induction generator such that the induction generator can be started as a second induction motor to determine the direction of rotation of the induction generator, to connect and disconnect the induction generator to the primary source of power, and to safely disconnect the induction generator from the primary source of power.

5. The RGL apparatus of claim 2 further comprising;
    a watt transducer for measuring the power output of the electrical device and regulating the ASD by use of the measured power output to adjust the speed of the induction motor up to a test limit.

6. The RGL apparatus of claim 2 further comprising;
    a watt transducer for measuring the power output of the induction generator; and a
    a watt transducer for measuring the power input to the electrical device.

7. The RGL apparatus of claim 1 wherein the electrical device is an uninterruptible power supply (UPS).

8. The RGL apparatus of claim 7 further comprising;
    a harmonic filter for reducing the harmonic distortion content of the UPS output.

9. The RGL apparatus of claim 1 wherein the electrical device is a standby generator.

10. The RGL apparatus of claim 1 further comprising;
    a first circuit breaker for connecting a normal load to the electrical device, the first circuit breaker controlled to isolate the electrical device for test purposes;
    a second circuit breaker for connecting the RGL apparatus input to the electrical device after the electrical device has been isolated for test purposes; and
    a third circuit breaker for connecting the RGL apparatus output to the primary source of power when the RGL unit is supplying the A % of the test power.

11. A method of testing an electrical device comprising:
    connecting the electrical device to a primary source of power;
    connecting an input of a regenerative load (RGL) unit to the electrical device as a load for the electrical device;
    connecting an output of the RGL unit to the primary source of power; and
    supplying A % of the power from the RGL unit to operate the electrical device during testing of the electrical device, whereby the electrical device receives 100% of the power it requires under load while using only (100-A) % of the power from the primary source of power.

12. The method of claim 11 wherein the step of supplying A % of the power comprises:
    coupling an induction motor to an induction generator in the RGL unit;
    adjusting the speed of the induction motor dependent upon the electrical device output; and
    supplying the A % of the power from the induction generator.

13. The method of claim 12 wherein the coupling of the induction motor to the induction generator further comprises:
    starting the induction generator as an induction motor;
    determining the direction of rotation of the induction generator is the same as the direction of rotation of the induction motor; and
    adjusting the direction of rotation of the induction generator if the direction of rotation is not the same as the direction of rotation of the induction motor.

14. The method of claim 12 wherein the adjusting the speed of the induction motor further comprises:
    measuring the power output of the electrical device; and
    adjusting the speed of the induction motor based on the measured power output of the electrical device to increase the load on the electrical device up to a specified test limit.

15. The method of claim 11 wherein the electrical device is an uninterruptible power supply (UPS).

16. A method of testing an uninterruptible power supply (UPS) for conserving power, the method comprising:
    connecting an input of the UPS to a primary source of power;
    connecting an input of a regenerative load (RGL) unit to the output of the UPS, the RGL unit containing an induction motor coupled to an induction generator;
    setting up the RGL unit for proper operation;
    connecting an output of the RGL unit to the primary source of power; and
    ramping up the speed of the induction motor in the RGL unit to increase the load on the UPS and to supply A % of the power to the UPS.

17. The method of claim 16 further comprises:
  measuring the power output of the UPS to regulate the speed of the induction motor in order to apply full load to the UPS;
  determining whether the UPS has been adequately tested; and
  stopping the test of the UPS if it has been determined the UPS has been adequately tested.

18. The method of claim 17 wherein stopping the test comprises:
  ramping down the speed of the induction motor to synchronous revolutions per minute (RPM);
  disconnecting the induction generator from the primary source of power;
  de-energizing the induction motor; and
  disconnecting the UPS from the RGL unit.

19. A method of claim 16, wherein the step of setting up the RGL unit further comprises:
  connecting the UPS to an adjustable speed drive (ASD);
  starting and stopping an induction motor driven by the ASD, the induction motor coupled to an induction generator;
  checking the direction of rotation of the induction motor;
  starting and stopping the induction generator;
  checking the direction of rotation of the induction generator;
  determining if the direction of rotation of the induction motor is the same as the direction of rotation of the induction generator; and
  adjusting either the induction motor or the induction generator to reverse the direction of rotation if it was determined that the direction of rotation was different.

20. The method of claim 16 further comprises:
  measuring the harmonic content on the UPS output; and
  stopping the test if the measured harmonic content exceeds a predetermined threshold.

* * * * *